(12) United States Patent
Ikegami (10) Patent No.: US 11,348,775 B2
(45) Date of Patent: May 31, 2022

(54) MASS SPECTROMETRY DATA PROCESSING PROGRAM

(71) Applicant: SHIMADZU CORPORATION, Kyoto (JP)

(72) Inventor: Masahiro Ikegami, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 17/059,702

(22) PCT Filed: Jun. 1, 2018

(86) PCT No.: PCT/JP2018/021284
§ 371 (c)(1),
(2) Date: Nov. 30, 2020

(87) PCT Pub. No.: WO2019/230000
PCT Pub. Date: Dec. 5, 2019

(65) Prior Publication Data
US 2021/0217599 A1 Jul. 15, 2021

(51) Int. Cl.
*H01J 49/00* (2006.01)
*G01R 23/15* (2006.01)
*G03F 3/00* (2006.01)

(52) U.S. Cl.
CPC .......... *H01J 49/0036* (2013.01); *G01R 23/15* (2013.01); *G03F 3/00* (2013.01)

(58) Field of Classification Search
CPC . G01N 27/62; G01R 23/15; G03F 3/00; H01J 49/0036
See application file for complete search history.

(56) References Cited

U.S. PATENT DOCUMENTS 6,983,213 B2 * 1/2006 Wang ................. G06K 9/00496
702/85

FOREIGN PATENT DOCUMENTS

JP 2017-32465 A 2/2017

OTHER PUBLICATIONS

International Search Report for PCT/JP2018/021284 dated Aug. 14, 2018 (PCT/ISA/210).
Written Opinion for PCT/JP2018/021284 dated Aug. 14, 2018 (PCT/ISA/237).

* cited by examiner

*Primary Examiner* — Roy Y Yi
*Assistant Examiner* — Geoffrey T Evans
(74) *Attorney, Agent, or Firm* — Sughrue Mion, PLLC (57) ABSTRACT

A mass spectrometric data processing program that processes mass spectrometric data causes a data processor including a computer to execute a data conversion process in which representative value data, which is representative value data including a data set of a representative value of mass-to-charge ratio information and an ion intensity with respect to the representative value, is converted into profile data, which is ion intensity data with respect to the mass-to-charge ratio information.

5 Claims, 6 Drawing Sheets

| m/z | Ip |
|---|---|
| 1000 | 5 |
| 1001 | 4 |
| 1002 | 7 |
| 1003 | 9 |
| 1004 | 11 |
| 1005 | 53 |
| 1006 | 127 |
| 1007 | 275 |
| 1008 | 164 |
| 1009 | 43 |
| 1010 | 5 |
| 1011 | 4 |
| 1012 | 7 |
| 1013 | 8 |
| 1014 | 18 |
| 1015 | 77 |
| 1016 | 174 |
| 1017 | 320 |
| 1018 | 164 |
| 1019 | 53 |
| 1020 | 11 |
| 1021 | 7 |
| 1022 | 8 |
| 1023 | 4 |
| ⋮ | ⋮ |

FIG. 3(b)

| m/z | Is |
|---|---|
| 1007.2 | 662 |
| 1016.8 | 788 |
| ⋮ | ⋮ |

MASS SPECTROMETRY DATA PROCESSING PROGRAM

CROSS REFERENCE TO RELATED APPLICATIONS

This application is a National Stage of International Application No. PCT/JP2018/021284 filed Jun. 1, 2018.

TECHNICAL FIELD

The present invention relates to a mass spectrometric data processing program.

BACKGROUND ART

In mass spectrometry, a molecular weight and the like to be analyzed is analyzed based on mass spectrum data obtained by various mass spectrometry devices (time-of-flight mass spectrometry device, quadrupole mass spectrometry device, sector mass spectrometry device, Fourier transform ion cyclotron resonance mass spectrometry device, etc.).

Profile data is one format of mass spectrum data. In the profile data, data address is mass-to-charge ratio (m/z), and data value is ion intensity at each address. In the profile data, data of an ion intensity for a certain type of ion is distributed on addresses in a range that has the same extent as an extent of a resolution of the mass spectrometry device and is centered on an address corresponding to a mass-to-charge ratio m/z specific to the ion.

Another form of mass spectrum data is representative value data having a set of a value of m/z, which is the center of a detection intensity, and the detection intensity at the m/z, or an integrated value of the detection intensity at the m/z in a predetermined range with the m/z as the center, for each detected ion. The representative value data is also called centroid data (see PTL1).

CITATION LIST

Patent Literature

PTL1: Japanese Laid-Open Patent Publication No. 2017-32465

SUMMARY OF INVENTION

Technical Problem

Devices and programs that analyze mass spectrum data are required to support both profile data format and representative value data format. However, since data structures of the profile data and the representative value data are fundamentally different, it is necessary to separately develop and provide a processing program for each format in order to support both formats. This leads to a problem of an increased development and maintenance cost.

Solution to Problem

According to the 1st aspect of present invention, a mass spectrometric data processing program that processes mass spectrometric data causes a data processor including a computer to execute a data conversion process in which representative value data, which is representative value data including a data set of a representative value of mass-to-charge ratio information and an ion intensity with respect to the representative value, is converted into profile data, which is ion intensity data with respect to the mass-to-charge ratio information.

According to the 2nd aspect of present invention, the mass spectrometric data processing program is in the 1st aspect, wherein: when the data processor converts the representative value data into the profile data, at least one of pieces of information corresponding to a type of the representative value data, a type of data representing the ion intensity, a detection principle of the mass spectrometry device that acquired the mass spectrometric data, and a resolution of the mass spectrometry device that acquired the mass spectrometric data is loaded as processing information for determining the conversion process, and a conversion condition is determined based on the loaded processing information.

According to the 3rd aspect of present invention, the mass spectrometric data processing program is in the 2nd aspect, and causes the data processor to: display a message on a display device, the message prompting the user to input the at least one piece of information; load the at least one piece of information input to an input unit by the user; and determine the conversion condition based on the at least one piece of information.

According to the 4th aspect of present invention, the mass spectrometric data processing program is in the 2nd aspect, and causes the data processor to: load the at least one piece of information from the mass spectrometric data; and determine the conversion condition based on the at least one piece of information.

According to the 5th aspect of present invention, the mass spectrometric data processing program is in any one of the 1st through 4th aspect, and causes the data processor to: determine whether the mass spectrometric data is the representative value data; if the mass spectrometric data is the representative value data, load a notation format of the representative value; determine the conversion condition based on the loaded notation format; and convert the representative value data into the profile data based on the determined conversion condition.

According to the 6th aspect of present invention, the mass spectrometric data processing program is in the 1st aspect, and causes the data processor to: determine whether the mass spectrometric data is the representative value data; if the mass spectrometric data is the representative value data, determine whether processing information for determining a conversion process in the data conversion process is included; and if it is determined that the processing information is included, determine a conversion condition of the conversion process based on the processing information.

Advantageous Effects of Invention

According to a mass spectrometric data processing program of the present invention, representative value data can be converted into profile data. As a result, both the representative value data and the profile data can be processed only by the processing program for the representative value data.

BRIEF DESCRIPTION OF DRAWINGS

FIG. 3(a) shows an example of profile data, and FIG. 3(b) shows an example of representative value data.

DESCRIPTION OF EMBODIMENTS

Now, a mode for carrying out the present invention will be described with reference to the drawings.

Figure 1:
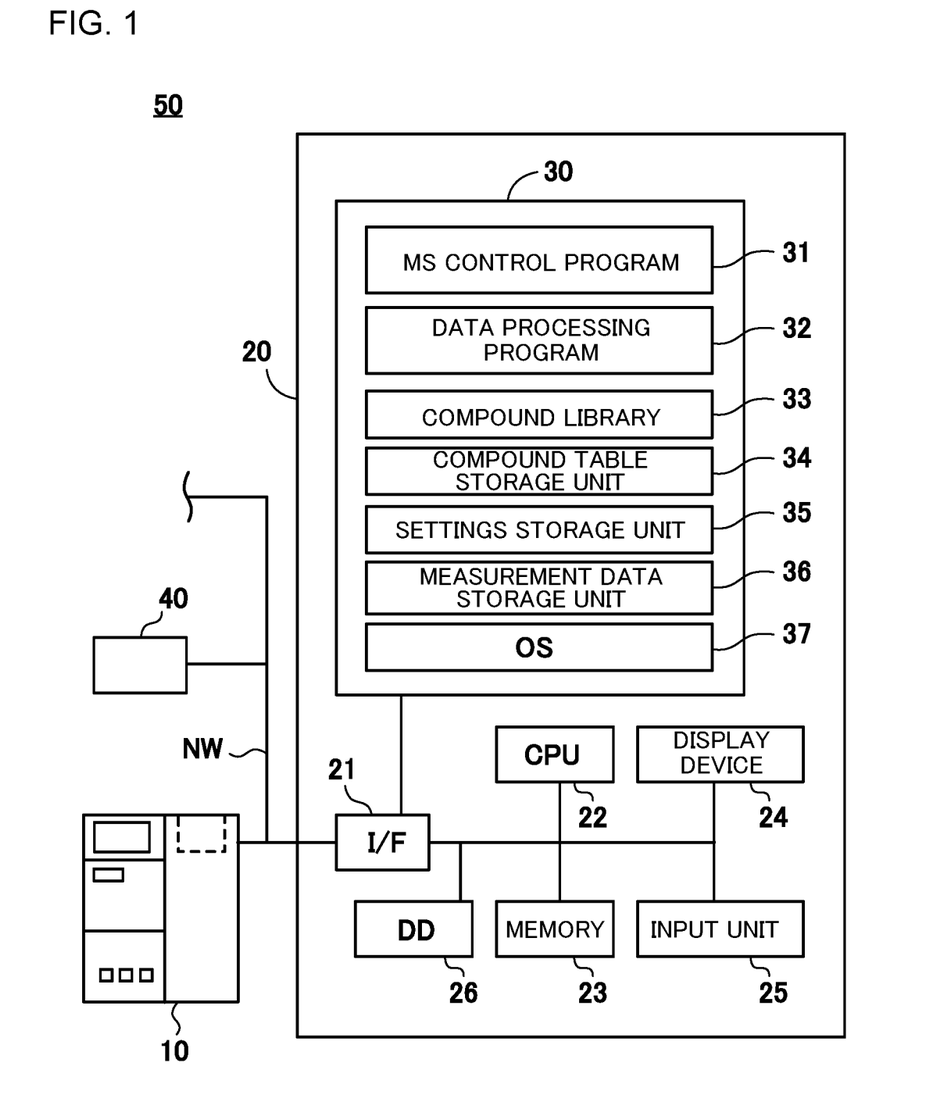
FIG. 1 is a block diagram showing a schematic configuration of a data processor and a sample analysis system in which a data processing program according to an embodiment of the present invention operates.

A mass spectrometric data processing program according to the present invention is used in a mass spectrometry system 50 shown in FIG. 1. The mass spectrometry system 50 includes a data processor 20 that is operated by a data processing program 32 in an embodiment of the present invention, a mass spectrometry device 10, and a server 40 that is connected to the data processor 20 and the mass spectrometry device 10 via a network. The data processor 20 controls the mass spectrometry device 10 via a network cable NW. The data processor 20 further acquires measurement data from the mass spectrometry device 10, and analyzes and processes the acquired data.

The data processor 20 includes a CPU (Central Processing Unit) 22 which is a central processing unit of the data processor 20, a memory 23, a display device (display unit) 24 including a LCD (Liquid Crystal Display) and the like, and an input unit 25 including a keyboard, a mouse, and the like, and a storage unit 30 including a mass storage device such as a hard disk or a SSD (Solid State Drive).

The storage unit 30 stores an OS (Operating System) 37, a MS control program 31 that controls the mass spectrometry device 10, a data processing program 32 that processes data measured by the mass spectrometry device 10, and a compound library 33. Additionally, the storage unit 30 includes a compound table storage unit 34, a settings storage unit 35, and a measurement data storage unit 36.

The compound library 33 contains structural formulas, mass spectra, and the like as information necessary for qualitative analysis of various compounds. The data processor 20 further includes an interface (I/F) 21 that serves for direct connection with external devices, and connection with external devices and the like via a network such as a LAN (Local Area Network). The I/F 21 connects the data processor 20 to the mass spectrometry device 10 via the network cable NW.

The CPU 22, the memory 23, the storage unit 30, and the interface 21 constitute a computer.

The data processing program 32 can control the data processor 20 including the CPU 22 to transmit mass spectrometric data (hereinafter also referred to as measurement data) to the external server 40 via the network cable NW and save the data in the external server 40. The data processing program 32 can further load the measurement data saved in the server 40 to analyze and process the data.

Prior to measurement with the mass spectrometry device 10, a user operates the input unit 25 as appropriate so that the CPU 22 executes the MS control program 31 to display various setting screens on the display device 24. The user sets (inputs) various measurement conditions of the mass spectrometry device 10 in accordance with displayed items on the display device 24. The set measurement conditions are stored in the settings storage unit 35 as an analysis method. After setting such measurement conditions and the like, the user instructs the mass spectrometry device 10 to start measurement according to a processing procedure of the MS control program 31, and the measurement is started. The measurement data measured by the mass spectrometry device 10 is transmitted to the data processor 20 via the network NW and stored in the memory 23. Analyzing and processing the measurement data loaded from the memory 23 is executed by the CPU 22 in accordance with the data processing procedure of the data processing program 32.

Here, the MS control program 31 and the data processing program 32 are installed in the same data processor so that the data processor functions as the controller/data processor 20; however, these programs may be installed in a separate data processor so that a controller for controlling the mass spectrometry device 10 may be separate from the data processor 20.

The data processing program 32 executes various processes on the measurement data measured by the mass spectrometry device 10 and stored in the memory 23, or the measurement data loaded from the external server 40. For example, a spectrum creation unit 41 creates a mass spectrum representing mass and intensity of ions detected at a predetermined point in time. Further, a chromatogram creation unit 42 creates a mass chromatogram representing a time profile of an ion intensity at a given mass, a total ion chromatogram representing a time profile of a sum of ion intensities detected at individual points of time, and the like. The mass spectrum and chromatogram created as described above are also stored in the measurement data storage unit 36.

Further, the created mass spectrum and mass chromatogram and the like are transmitted to the external server 40 via the network cable NW as needed.

Figure 2:
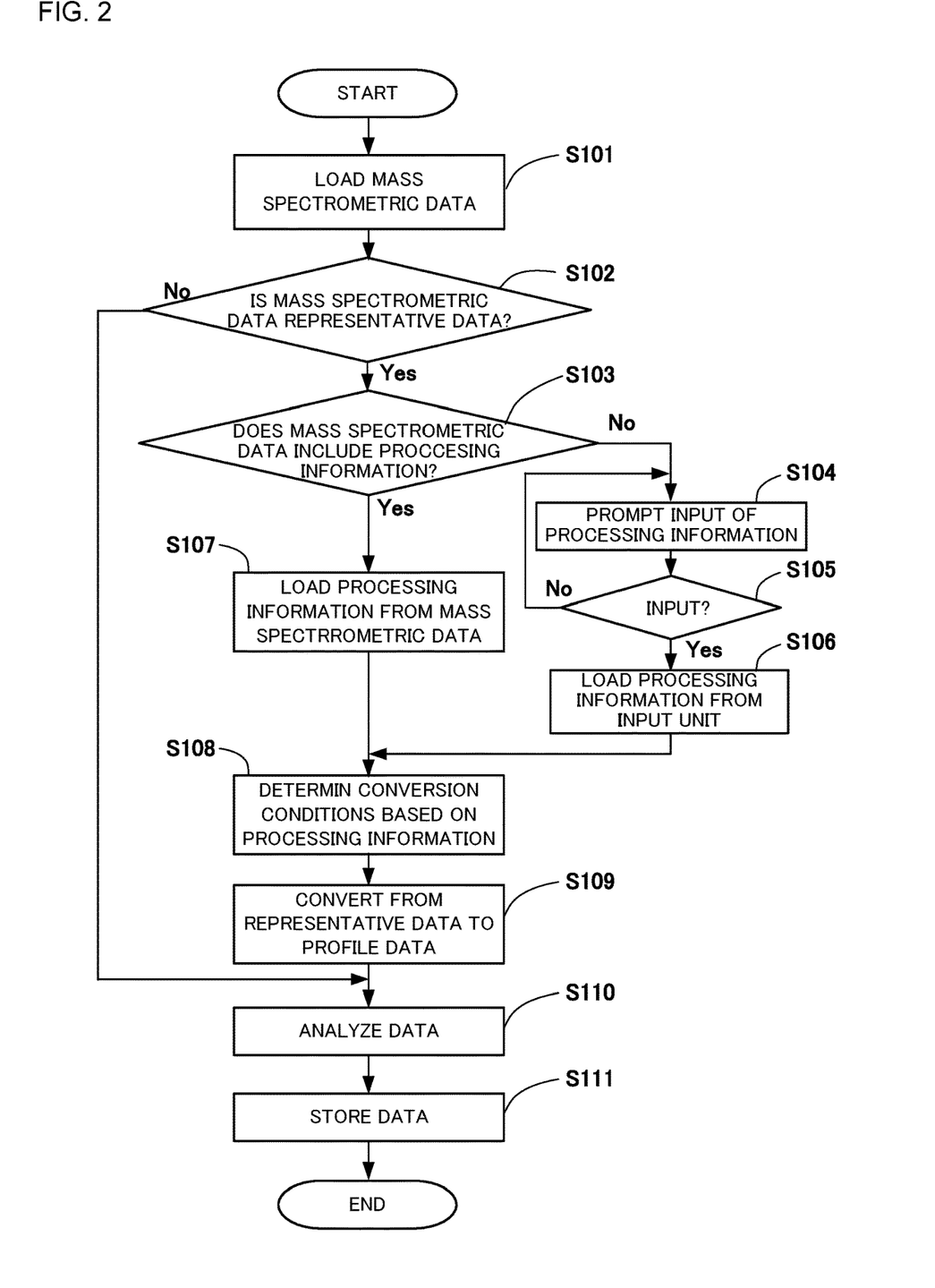
FIG. 2 is a flowchart showing a process flow in the data processing program of one embodiment.

FIG. 2 is a flowchart illustrating data processing steps performed by the data processing program 32 controlling the data processor 20.

In step S101, the data processing program 32 controls the data processor 20 to load the mass spectrometric data transmitted from the mass spectrometry device 10 and stored in the memory 23 or the mass spectrometric data saved in the external server 40 via the network cable NW.

In step S102, the data processing program 32 causes the data processor 20 to determine whether the loaded mass spectrometric data is representative value data. Whether it is representative value data or profile data can be identified depending on a difference in data structure.

If the loaded mass spectrometric data is not the representative value data, the process proceeds to step S110.

If the loaded mass spectrometric data is the representative value data, the process proceeds to step S103 where the data processing program 32 causes the data processor 20 to determine whether processing information for converting the representative value data into the profile data is included.

Details of the above-described representative value data and processing information will be described later.

If the loaded mass spectrometric data includes the above-described processing information, the process proceeds to step S107 where the data processing program 32 causes the data processing apparatus 20 to load the above-described processing information from the mass spectrometric data. Then, the process proceeds to step S108.

If the loaded mass spectrometric data does not include the above-described processing information, the process proceeds to step S104 where the data processing program 32 causes the data processor 20 to display a message prompting to input the processing information, on the display device 24. In step S105, it is determined whether the processing information has been input. Once the user inputs the processing information to the input unit 25, a positive determination is made in step S105 and the process proceeds to step S106 where the data processing program 32 causes the data processor 20 to load the processing information input to the input unit 25. Then, the process proceeds to step S108.

In step S108, a data conversion processing format is determined based on the loaded processing information. The conversion processing format will be described later.

In step S109, the data processing program 32 causes the data processor 20 to perform a conversion from the representative value data into the profile data, using the conversion processing format determined in step S108 based on the above-described processing information. Details of this conversion will be described later.

In step S110, the data processing program 32 causes the data processor 20 to analyze the profile data and calculate a desired analysis result desired by the user. Therefore, it is only necessary to install a data processing program for profile data analysis in the data processor 20 and it is not necessary to install any data processing program for representative value data analysis.

The calculated analysis result is stored in the measurement data storage unit 36 in step S111. The created analysis result is transmitted to the external server 40 via the network cable NW as needed.

Figure 3A:
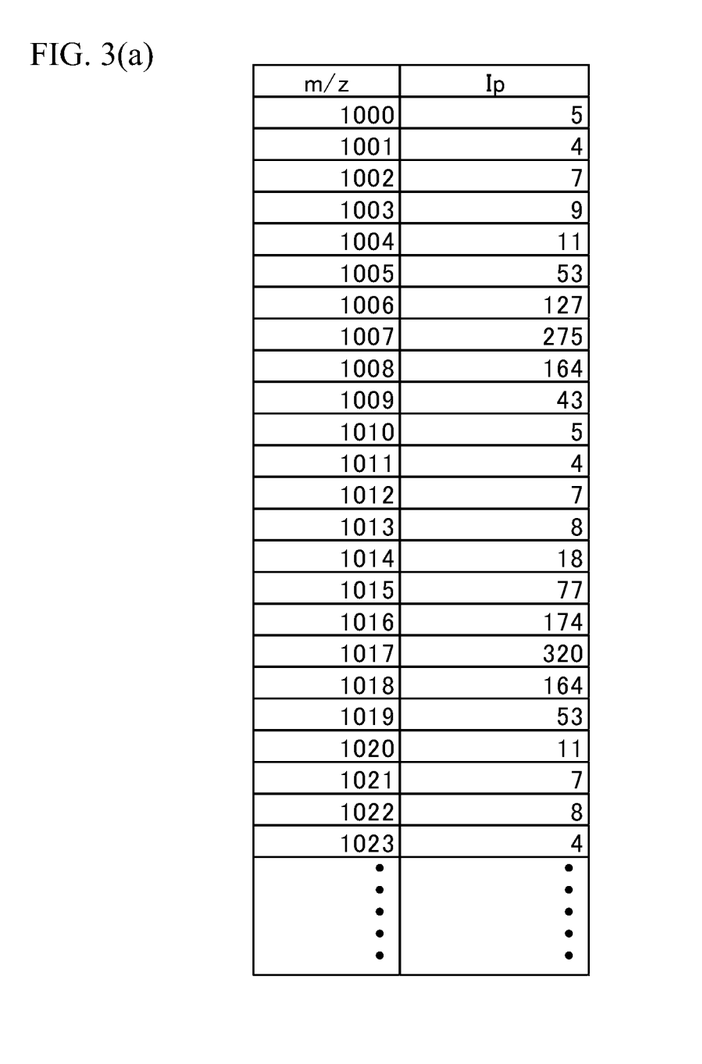
FIGS. 3(a)-3(b) shows examples of profile data and representative value data.
Figure 3B:
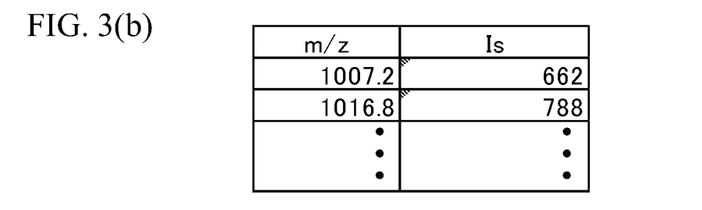

FIGS. 3(*a*)-3(*b*) are views showing an example of mass spectrometric data, FIG. 3(*a*) is a table showing an example of profile data and FIG. 3(*b*) is a table showing an example of representative value data. Profile Data The profile data shown in FIG. 3(*a*) is close to raw data of mass spectrometric results output from a general mass spectrometry device 10, in which with respect to each of mass-to-charge ratios (m/z) as addresses, an ion intensity Ip is stored as corresponding data.

Hereinafter, the address of the profile data is also referred to as horizontal axis, and the ion intensity data is also referred to as vertical axis. These designations are used in a case where the profile data of FIG. 3(*a*) is graphically shown.

The profile data shown in FIG. 3(*a*) has two points, that is, the mass-to-charge ratio (m/z) 1007 and 1017 where the ion intensity Ip has its peaks. The ion intensity Ip is relatively large near these two points and the ion intensity Ip decreases as a distance from these two points increases. However, the ion intensity Ip does not become 0 due to noise.

Since ions to be analyzed are diverse in actual mass spectrometry, it is necessary to provide a wide range of addresses in the profile data that include all mass-to-charge ratios (m/z) of various types of ions to be analyzed. Therefore, the profile data has a large number of data arranged vertically in FIG. 3(*a*) and thus data size becomes large.

Although the mass-to-charge ratios (m/z) as addresses are represented as integer values in FIG. 3(*a*), the ratios are not limited to integers. In most mass spectrometry devices 10, certain real numbers corresponding to the mass-to-charge ratios (m/z), such as detection points in time, are output as address values of the detection data.

Therefore, the addresses of the profile data may not represent the mass-to-charge ratios (m/z) itself, and intervals of the addresses may not be equal when they are converted into the mass-to-charge ratio (m/z).

In a case where the mass spectrometry device 10 is a time-of-flight mass spectrometry device, ions flying in the device are detected by a detector such as a microchannel plate (MCP), and the signals are sampled by a transient recorder at equal intervals for digitalizing. Therefore, a physical quantity corresponding to a detection point in time measured by the mass spectrometry device 10 is flight time (detection point in time). Given that flight time is T, flight distance is L, ion charge is e, mass is m, and extraction voltage for allowing ions to fly is V, the flight time T is expressed by $T=\sqrt{(m/2 \ eV)}$. Therefore, in the profile data sampled at equal intervals as the detection points in time, intervals between the addresses are not equal when converted into the mass-to-charge ratio, but extend in proportion to the square root mass-to-charge ratio $(\sqrt{m})/\sqrt{z}$.

For mass spectrometric data acquired by a sector mass spectrometer or a Fourier transform ion cyclotron resonance mass spectrometer (FT-ICR MS), addresses of the profile data are values corresponding to a physical quantity such as position information or frequency depending on a principle of each mass analyzer and ion detector. Here, intervals of the values are generally not equal when converted into the mass-to-charge ratio.

In this description, mass-to-charge ratio information means not only the mass-to-charge ratio (m/z) itself, but also a quantity corresponding to the mass-to-charge ratio (m/z), such as flight time (detection point in time), position information, or frequency, depending on principles of various types of mass analyzers and ion detectors.

Representative Value Data

On the other hand, in the example of the representative value data shown in FIG. 3(*b*), the data includes a set of a representative value, which represents the mass-to-charge ratio (m/z) as a center position of a portion where the ion intensity Ip has approximately its peak in the profile data shown in FIG. 3(*a*), and an intensity value Is corresponding to the ion intensity Ip near the peak. If there are a plurality of portions where the ion intensity Ip has approximately peaks, the representative value data has a plurality of above-described sets of the representative value and the intensity value Is and the number of the sets are the same as the number of the peak portions.

As will be described later, there are various methods of calculating the intensity value Is. In the case of the example of FIG. 3(*b*), the intensity value Is is defined as a sum of ion intensities Ip at points which are near a peak portion and have ion intensities Ip over 40 (points where the mass-to-charge ratio (m/z) is from 1005 to 1009, or points where the mass-to-charge ratio (m/z) is from 1015 to 1019).

In a case where the mass spectrometry device 10 is a time-of-flight mass spectrometry device, the profile data is sampled in small units (intervals) of mass-to-charge ratio information, and the amount of data is thus large because an ion intensity Ip is associated with each mass-to-charge ratio. For the representative value data, the data size can be made compact because the required number of sets of a representative value representing mass-to-charge ratio information and an intensity value Is is the same as the number of detected ions.

Since data structures of the profile data and the representative value data are significantly different as described above, the data processing program 32 may cause the data processor 20 to determine whether the loaded mass spectrometric data is the representative value data, in step S102. Specifically, the determination can be made depending on a data size of the mass spectrometric data, a proportion of tiny data included in the data value, a regularity of address values in the data, and the like. The reason why the determination can be made depending on the proportion of tiny data is that the profile data contains much tiny data due to noise, as described above.

The representative value data and the calculation method thereof will be described with reference to FIG. 4.

Figure 4:
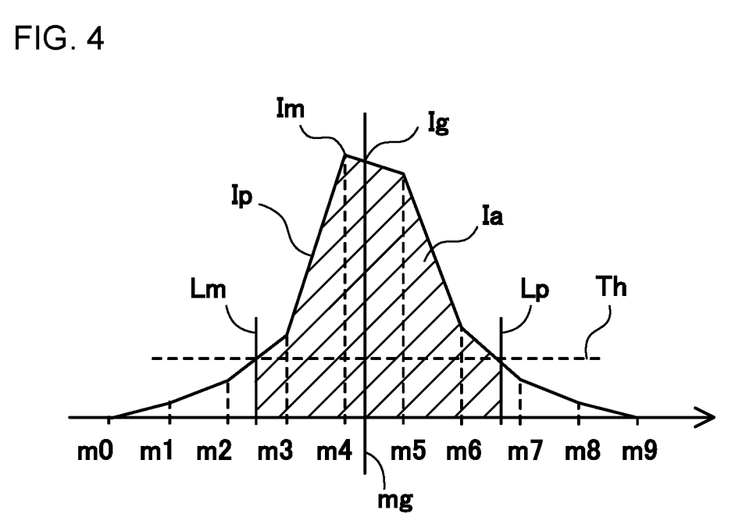
FIG. 4 shows a graph of a portion corresponding to one ion in profile data.

FIG. 4 is a graph showing an ion intensity Ip near an address of the mass-to-charge ratio (m/z) at which the ion intensity Ip has its peak in the profile data as shown in FIG. 3(a). The horizontal axis of the graph is the mass-to-charge ratio (m/z).

In the case of FIG. 4, the ion intensity Ip has a peak value Im at the mass-to-charge ratio of m4.

There are various formats of representative value data, and therefore various calculation methods thereof.

As an example of the representative value data, a mass-to-charge ratio value (address) m4 at which the ion intensity Ip has its peak is used as the representative value representing the center position of the peak, and an ion intensity (peak intensity) Im at the address m4, which is a peak intensity (maximum intensity), is set as the intensity value Is. This format is hereinafter referred to as a maximum intensity format.

As another example of the representative value data, a gravity center position mg of the ion intensity Ip is determined in a range near the peak position of the ion intensity Ip where the ion intensity Ip is larger than a predetermined threshold value Th, and the gravity center position mg is set as a representative value that represents the center position of the peak. The calculation of the gravity center position mg can be performed as follows. The gravity center position is calculated as a gravity center position mg of a shaded region Ia which is a range of the mass-to-charge ratio (m/z) in which the ion intensity Ip is equal to or higher than a threshold value Th, that is, the mass-to-charge ratio in FIG. 4 is in a range from Lm to Lp, in the graph of the ion intensity Ip in FIG. 4 in which the ion intensity data at each address position of the mass-to-charge ratio (m/z) is linearly interpolated.

In a case where the gravity center position mg is employed as the representative value representing the center of the ion intensity, the gravity center intensity Ig at the gravity center position mg in the linearly interpolated graph of the ion intensity Ip in FIG. 4 may be employed as the intensity value Is. This format is hereinafter referred to as a gravity center intensity format. In the gravity center intensity format, polynomial interpolation or spline interpolation may be performed, instead of the linear interpolation, when determining the gravity center intensity Ig at the gravity center position mg of the graph.

On the other hand, an area of the region Ia shaded in FIG. 4 may be calculated after replacing all intervals between data points (addresses) with 1, and the calculated value may be employed as the intensity value Is. This format is hereinafter referred to as a gravity center integration format.

Further, an area of the region Ia may be calculated in consideration of values of address intervals (sampling intervals) represented by m/z of data points, and the calculated value may be employed. This format is hereinafter referred to as an area format.

In the present embodiment, it is assumed that the representative value data is expressed in any of the maximum intensity format, the gravity center intensity format, the gravity center integration format, and the area format.

Of the above-described four formats of the representative value data, the gravity center integration format and the area format have information on a total intensity integrated value of one peak of the ion intensity (hereinafter also referred to as total information). However, the maximum intensity format and the gravity center intensity format do not have information on a total intensity integrated value of one peak of the ion intensity. Therefore, in converting the representative value data into the profile data, it is important to know the format of the representative value data.

Here, the total information in the gravity center integration format can also be defined as an integrated value of an ion intensity measured in a predetermined range in which a mass-to-charge ratio (m/z) indicating a peak of the ion intensity is a median value.

In the program of the present embodiment, it is necessary to determine conversion conditions based on information (collectively referred to as processing information) corresponding to a type of the representative value data, a type of the intensity value Is representing the ion intensity, and a detection principle and a resolution of the mass spectrometry device that acquired the mass spectrometric data.

Here, the type of the representative value data is any one of the maximum intensity format, the gravity center intensity format, the gravity center integrated value format, and the area format. The type of data representing the ion intensity is a peak intensity Im or a gravity center intensity Ig, or a total intensity integrated value or area value of one peak. The detection principle of the mass spectrometry device that acquired the mass spectrometric data is a sampling interval in terms of the mass-to-charge ratio determined by a combination of the mass spectrometry and the detector. The resolution of the mass spectrometry device that acquired the mass spectrometric data is a resolution of the mass-to-charge ratio (m/z) that can be measured, that is, a full width at half maximum of one peak of the profile data.

Figure 5A:
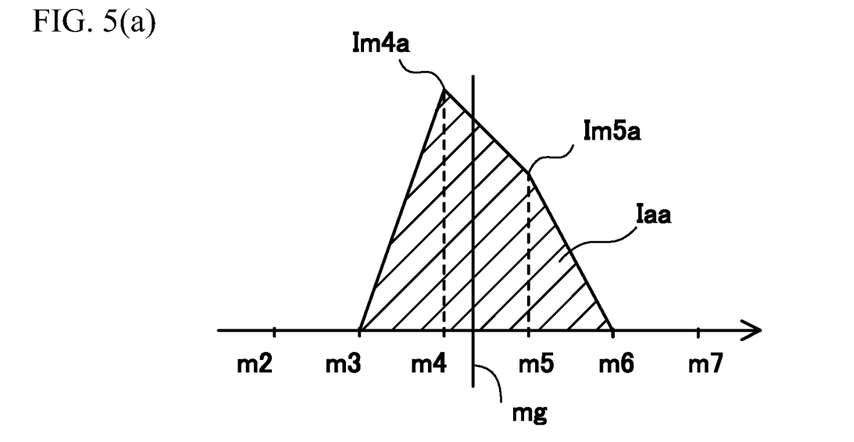
FIGS. 5(a)-5(c) shows examples of a way of conversion from representative value data to profile data.
Figure 5B:
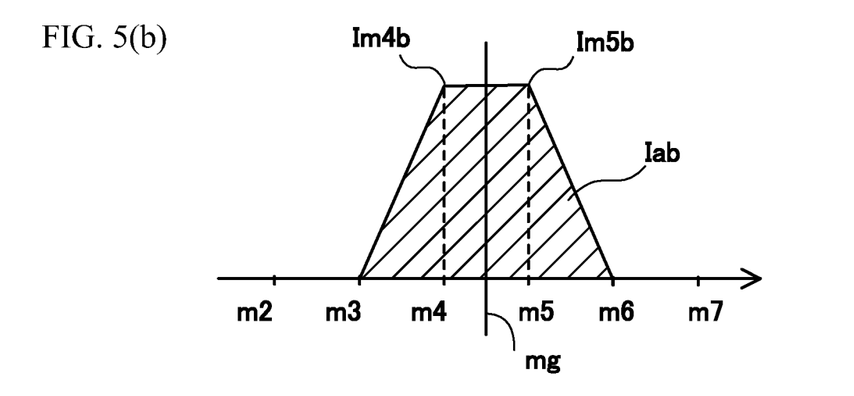
Figure 5C:
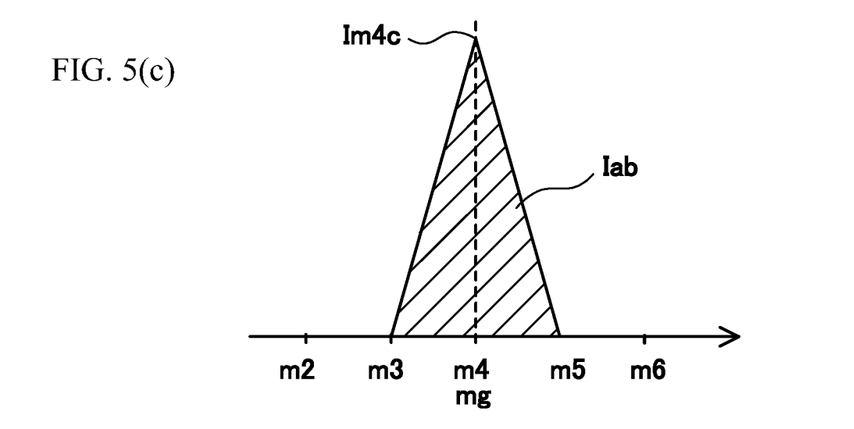

Data Conversion From Representative Value Data In Gravity Center Integration Format FIGS. 5(a)-5(c) are is views illustrating a method of converting the representative value data in the gravity center integration format, among the conversion from the representative value data into the profile data executed in step S109. As described above, the gravity center integration format has the above-described total information, that is, information on the total intensity integrated value of one peak of the ion intensity. Therefore, for a data array having addresses of the mass-to-charge ratio (m/z), the representative value data in the gravity center integration format can be converted into profile data by allocating ion intensities to some addresses near the gravity center position mg so that their sum is equal to the integrated value and the full width at half maximum of the peak of the profile corresponds to the mass resolution.

In the example shown in FIGS. 5(a)-5(c), the intensity value Is in the representative value data is allocated to an address m4 and an address m5 near the gravity center position mg. An ion intensity Im4a allocated to the address m4 and an ion intensity Im5a allocated to the address m5 are respectively as follows:

$$Im\,4a = Is \times |mg - m5|/(m5 - m4) \quad (1)$$

$$Im\,5a = Is \times |mg - m4|/(m5 - m4) \quad (2)$$

FIG. 5(a) shows an example in which the gravity center position mg is closer to the address m4 than the address m5. Therefore, the ion intensity Im4a of the address m4 is larger than the ion intensity Im5a of the address m5.

FIG. 5(b) shows an example in which the gravity center position mg is exactly in the middle of the address m4 and the address m5. Therefore, the ion intensity Im4b of the address m4 and the ion intensity Im5b of the address m5 are equal to each other.

FIG. 5(c) shows an example in which the gravity center position mg coincides with the address m4. Here, the entire intensity value Is is the ion intensity Im4c at the address m4.

When the interval between addresses (sampling) of the mass-to-charge ratio (m/z) is set to be approximately half the mass resolution, the full width at half maximum of the peak of the profile created by the above-described method corresponds to the mass resolution. However, when the interval between addresses (sampling) is narrower, the intensity value may be allocated to a larger number of addresses near the gravity center so that the full width at half maximum of the peak corresponds to the mass resolution.

Data Conversion From Representative Value Data In Area Format

When converting from representative value data in the area format to profile data. In FIGS. 5(a)-5(c), for a data array having addresses of the mass-to-charge ratio (m/z), the representative value data in the area format can be converted into profile data by allocating an ion intensity to some addresses near the gravity center position mg so that an area value of the shaded portion is equal to the representative value and the full width at half maximum of the peak of the profile corresponds to the mass resolution.

On the other hand, among the four formats of the representative value data, the maximum intensity format and the gravity center intensity format do not have information on the total intensity integrated value of one ion intensity, that is, the above-described total information. Therefore, a conversion method different from the conversion in the gravity center integration format is required.

Figure 6A:
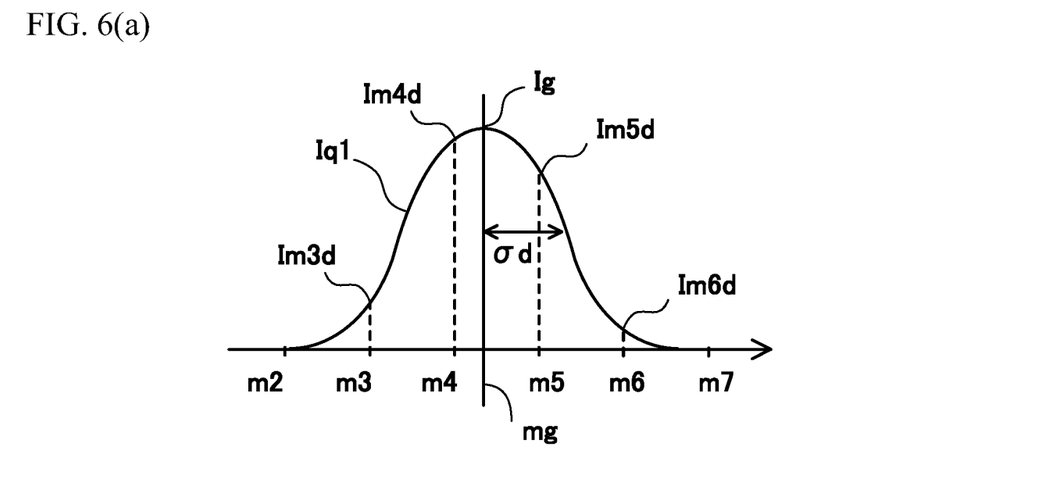
FIGS. 6(a)-6(c) shows another example of a way of conversion from representative value data to profile data.
Figure 6B:
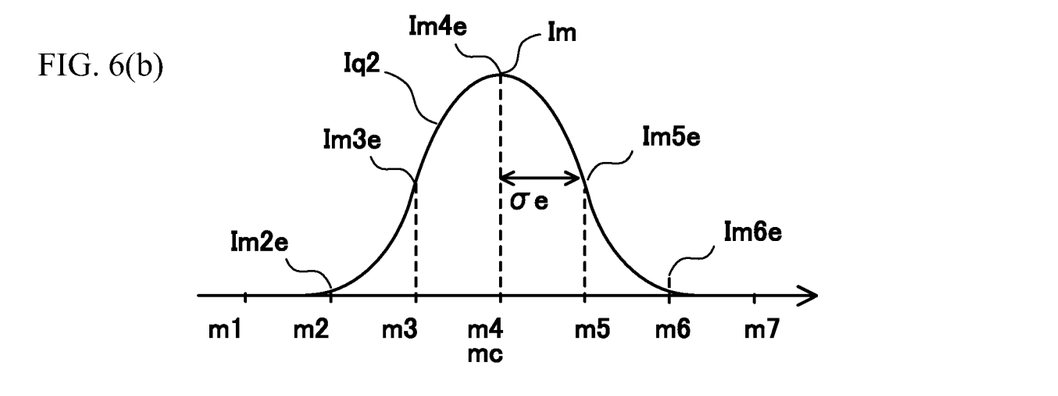
Figure 6C:
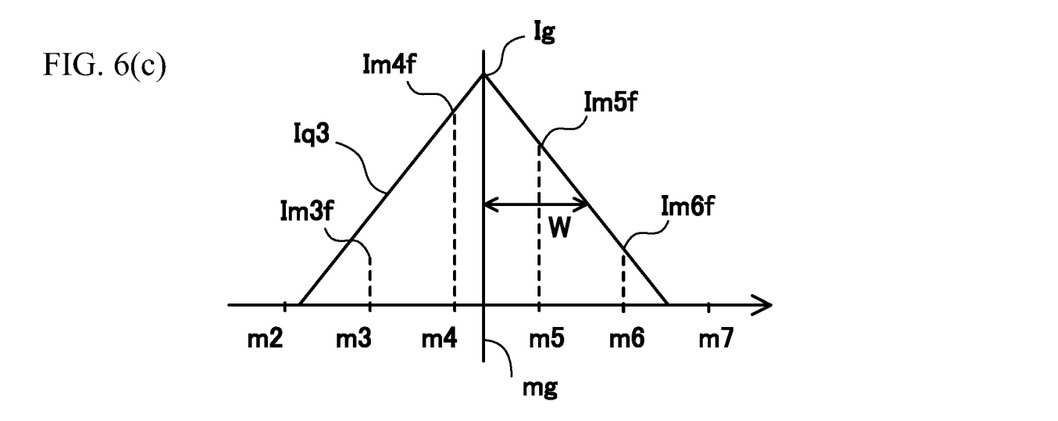

FIGS. 6(a)-6(c) are graphs illustrating a method of converting representative value data in the maximum intensity format and the gravity center intensity format, among conversions from representative value data into profile data executed in step S109.

Data Conversion From Representative Value Data In Gravity Center Intensity Format FIG. 6(a) is a graph illustrating an example of a method of converting representative value data in the gravity center intensity format. In FIG. 6(a), as in FIGS. 5(a)-5(c), the gravity center position mg is assumed to be located between the address m4 and the address m5 of the mass-to-charge ratio (m/z) of the profile data. In the method of this example, the data distributed near the gravity center position mg in the representative value data is converted into profile data under the assumption that the data is distributed on addresses in a Gaussian distribution having a standard deviation σd.

That is, an ion intensity Iq1 at each address mj (m1, m2, m3, . . . ) is calculated with the gravity center intensity Ig shown in FIG. 4, based on:

$$Iq1 = Ig \times exp[-\{(mj-mg)/\sigma d\}^2/2] \quad (3)$$

and is allocated to each address mj.

If the value of Iq1 is equal to or lower than a predetermined value (for example, 5% of the gravity center intensity Ig), allocation to that address may be not necessary. In FIG. 6(a), ion intensities Im3d, Im4d, Im5d, and Im6d are allocated to the addresses m3 to m6, respectively.

Data Conversion From Representative Value Data in Maximum Intensity Format

FIG. 6(b) is a graph illustrating an example of a method of converting representative value data in the maximum intensity format. The conversion method in this case is basically the same as the conversion method shown in FIG. 6(a). However, the difference is in that, in the case of the maximum intensity format, the representative value indicating the center position of the peak of the ion intensity matches an address of the mass-to-charge ratio (m/z) (the representative value does not become a value between the addresses).

FIG. 6(b) illustrates a case where the representative value mc indicating the center position of the peak of the ion intensity is an address m4, as an example. Further, data distributed near the center position (address) m4 in the representative value data is converted into profile data, assuming that the data is distributed on addresses in a Gaussian distribution having a standard deviation σe.

That is, an ion intensity Iq2 at each address mj (m1, m2, m3 . . . ) is calculated with data of the maximum intensity Im in the representative value data, based on:

$$Iq2 = Im \times exp[-\{(mj-mc)/\sigma d\}^2/2] \quad (4)$$

and is allocated to each address mj.

When the value of Iq2 is equal to or lower than a predetermined value (for example, 5% of the maximum intensity Im), allocation to that address may be not necessary. In FIG. 6(b), ion intensities Im2d, Im3d, Im4d, Im5d, and Im6d are allocated to the addresses m2 to m6, respectively.

The distribution for ion intensity allocation in converting the representative value data in the maximum intensity format and the gravity center intensity format is not limited to the Gaussian distribution described above.

Other Examples of Data Conversion from Representative Value Data in Maximum Intensity Format FIG. 6(c) is a graph illustrating a modified example of the method of converting the representative value data in the gravity center intensity format. In FIG. 6(c), a triangular distribution Iq3 is used as a distribution for allocation. The triangular distribution Iq3 is defined by the half width at half maximum W and the gravity center intensity Ig in the representative value data. An ion intensity allocated to each address mj (m3, m4, m5, m6) is calculated based on:

$$Iq3 = Ig \times |mj - mg|/2W \quad (|mj - mg| < 2W) \quad (5)$$

$$Iq3 = 0 \quad (|mj - mg| \geq 2W) \quad (6)$$

and is allocated to each address mj.

Values of the standard deviations σd, σe and the half width at half maximum W described above may be preferably determined based on a resolution of the mass spectrometry device 10, which is included in processing information loaded from the mass spectrometric data in step S104 or processing information loaded from the input unit in step S106, for example. The standard deviations σd, σe, and the half width at half maximum W can be values obtained by multiplying the resolution of the mass spectrometry device 10 by a predetermined constant. Alternatively, the standard deviations σd, σe, and the half width at half maximum W can be directly loaded in step S104 or step S106.

In each example of data conversion from the representative value data described above, a conversion method from a set of a representative value representing one center position included in the representative value data and an intensity value Is has been described. However, in general, the representative value data includes a plurality of sets of the representative value and the intensity value Is. Therefore, in conversion, each of the plurality of sets is converted, and the profile data converted from each set is added so that the representative value data having a plurality of sets of the representative value and the intensity value Is can be converted into the profile data.

In the above-described example, the address (horizontal axis) of the converted profile data is assumed to be the mass-to-charge ratio (m/z), but the address is not limited to the mass-to-charge ratio (m/z). The address may be the mass-to-charge ratio information, which is a quantity corresponding to the mass-to-charge ratio (m/z), such as detection point in time, position information, or frequency, depending on principles of various types of mass analyzers and ion detectors as described above. Even in that case, the method of converting the representative value data to the profile data is basically the same as the above-described method.

For example, in a case where the mass spectrometry device 10 is a time-of-flight mass spectrometry device, it may be preferable to employ flight time (detection point in time) as the horizontal axis of the profile data because address (sampling) intervals becomes equal. When creating representative value data from profile data of a time-of-flight mass spectrometry device, if sampling points on the horizontal axis are flight times having equal intervals, the representative value can be correctly proportional to the amount of ions detected by the detector in any of the gravity center integration format and the area format.

On the other hand, in the profile data of the time-of-flight mass spectrometry device, when a value converted from the flight time into the mass-to-charge ratio (m/z) is used as the horizontal axis (address), the address (sampling) intervals are not equal as described above and extend according to the mass-to-charge ratio (m/z). Therefore, in the area format, the area value is calculated to be excessive for a peak at a higher mass-to-charge ratio. In this case, the representative value and the amount of ions included in the peak can be proportional to each other by using the gravity center integration format.

Even in this case, the above-described problem of over-calculation does not occur even in the area format if the signal intensity on the vertical axis is corrected according to the mass-to-charge ratio (m/z), when the horizontal axis is converted from the flight time into the mass-to-charge ratio (m/z). However, in general, the signal intensity value on the vertical axis is often not corrected when the physical quantity on the horizontal axis is converted into the mass-to-charge ratio.

In contrast thereto, if the signal intensity on the vertical axis is corrected according to the mass-to-charge ratio (m/z), an error occurs in a result calculated by the gravity center integration calculation format.

Therefore, when creating the representative value data from the profile data in which the address is converted from the physical quantity in the ion detection into the mass-to-charge ratio as described above, it is necessary to select a calculation method so that the representative value correctly represents the ion amount depending on the detection principle of the mass spectrometry device.

On the other hand, when creating the profile data from the representative value data, it is also impossible to create profile data exactly corresponding to ion amount in a case where calculation is performed while the address is the mass-to-charge ratio, unless the same method as that when converting the representative value data in the gravity center integration format is used.

In the profile data of the time-of-flight mass spectrometry device, when the data is processed with the horizontal axis as the flight time, the addresses have equal intervals, so that correct conversion can be performed with any of the gravity center integration format and the area format which convert the representative value data.

Similarly, in mass spectrometry devices having other principles, calculation may be easy or accurate when using a physical quantity that has been used in ion detection such as flight time, instead of the mass-to-charge ratio (m/z), as the address of the profile data in the conversion process.

However, the address of the data input to the mass spectrometric data processing program of the present embodiment is often the mass-to-charge ratio (m/z), and the conversion formula or its equivalent information is required in order to convert the mass-to-charge ratio into a physical quantity depending on the detection principle.

In the case of a time-of-flight mass spectrometry device, the flight time T can be easily converted into a mass-to-charge ratio (m/z) with the above-described relational expression: $T=\sqrt{(m/2\ eV)}$. However, more desirably, it is necessary to perform mutual conversion between mass and flight time based on information in a data table that records flight times of ions having various masses in an actual device. The same applies to mass spectrometry devices using other principles that record signals from detectors using other physical quantities.

If there is no information for converting into a physical quantity depending on the detection principle, the mass-to-charge ratio (m/z) is used as the address, and the representative value data is converted to the profile data with other input information in the most suitable way.

In the conversion from the representative value data into the profile data, in order to determine whether the address of the profile data should be the mass-to-charge ratio (m/z) or the physical quantity used in ion detection such as flight time, it is desirable to depend on the detection principle (detection method) of the mass spectrometry device that acquired the mass spectrometric data. In order to determine the detection principle of the mass spectrometry device, it is desirable to depend on information included in the processing information loaded from the mass spectrometric data in step S107 or the processing information loaded from the input unit in step S106.

Here, the detection principle may be, for example, information indicating that the mass spectrometry device 10 is a time-of-flight mass spectrometry device and the digital data (profile data) with flight time as the address is correctly associated with the ion amount, or information indicating which format for conversion between the representative data and profile data (area format or gravity center integration format) can correctly associate the signal intensity value with the ion amount, when the mass-to-charge ratio (m/z) is treated as the address. As another example, the detection principle is information indicating what kind of physical quantity should be used as the address to correctly associate the signal intensity with the amount of ions.

Further, the processing information loaded from the mass spectrometric data and the processing information loaded from the input unit in step S106 may include formulas or tables for conversion between the flight time or other physical quantities and the mass-to-charge ratio depending on the principle of the mass spectrometry device.

In the conversion from the representative value data to the profile data, the address (sampling) interval of the profile data can be arbitrarily determined in consideration of the above-described relationship between the signal intensity and the amount of ions. That is, the address interval of the profile data may be a value smaller or larger than the resolution of the mass spectrometry device 10 which acquired the representative value data.

Further, the program of the present embodiment may cause the data processor 20 to execute the method shown in FIG. 4 and the like to convert the profile data into the representative value data.

According to the above-described embodiment, the following operational advantages can be achieved.

(1) A mass spectrometric data processing program that processes mass spectrometric data, causes a data processor 20 including a computer to: execute a data conversion process (step S107 in FIG. 2) in which representative value data, which is representative value data including a data set of a representative value of mass-to-charge ratio information and an ion intensity with respect to the representative value, is converted into profile data, which is ion intensity data with respect to the mass-to-charge ratio information.

With this configuration, the representative value data (centroid data) can be converted into the profile data. Therefore, both the profile data and the representative value data (centroid data) can be processed only by a processing program for profile data.

(2) Further, in the mass spectrometric data processing program, when the data processor 20 converts the representative value data into the profile data, at least one of pieces of information corresponding to a type of the representative value data, a type of data representing the ion intensity, a detection principle of the mass spectrometry device that acquired the mass spectrometric data, and a resolution of the mass spectrometry device that acquired the mass spectrometric data is loaded as processing information for determining the conversion process, and a conversion condition is determined based on the loaded processing information. In this way, various formats of representative data can be suitably converted into profile data.

For example, when it is determined in step S102 that the mass spectrometric data is the representative value data, it is then determined in step S103 whether the mass spectrometric data include types of the representative value data (maximum intensity format, gravity center intensity format, gravity center integrated value format, area format). When a positive determination is made in step S103, it is determined which of the maximum intensity format, the gravity center intensity format, the gravity center integration format, or the area format is used as a notation format of the representative value data included in the mass spectrometric data, and conversion conditions suitable for the loaded notation format are determined in step S108 and the data conversion is then performed in step S109. The conversion conditions are conditions determining which data conversion process is used from any of FIGS. 5(*a*) to 5(*c*) in the gravity center integration format and area format, any of FIG. 6(*a*) or FIG. 6(*c*) in the gravity center intensity format, and FIG. 6(*b*) in the maximum intensity format.

(3) The mass spectrometric data processing program further causes the data processor 20 to: display a message on a display device 24, the message prompting the user to input the at least one piece of information (step S104); load the at least one piece of information input to the input unit 25 by the user (step S106); and determine the conversion condition based on the at least one piece of information (step S108). In the mass spectrometric data processing program configured in this way, various formats of representative value data can be more suitably converted into profile data.

(4) The mass spectrometric data processing program further causes the data processor to: load the at least one piece of information from the mass spectrometric data (step S107); and determine the conversion condition based on the at least one piece of information (step S108). In the mass spectrometric data processing program configured in this way, various formats of representative value data can be more suitably converted into profile data.

(5) The mass spectrometric data processing program further causes the data processor 20 to: determine whether the mass spectrometric data is the representative value data (step S102); if the mass spectrometric data is the representative value data, load a notation format of the representative value (step S107); determine the conversion condition based on the loaded notation format (step S108); and convert the representative value data into the profile data based on the determined conversion condition (step S109). In the mass spectrometric data processing program configured in this way, it is not necessary for the user to determine whether the mass spectrometric data is the representative value data. Therefore, an operational burden on the user can be reduced.

(6) The mass spectrometric data processing program further causes the data processor 20 to: determine whether the mass spectrometric data is the representative value data (step S102); if the mass spectrometric data is the representative value data, determine whether processing information for determining a conversion process in the data conversion process is included (step S103); and if it is determined that the processing information is included, determine a conversion condition of the conversion process based on the processing information (step S108). In the mass spectrometric data processing program configured in this way, it is not necessary for the user to determine whether the mass spectrometric data is the representative value data and whether processing information is included. Therefore, an operational burden on the user can be reduced.

The processing program shown in FIG. 2 is only an example, and specifications and forms of programs implemented in the processor may vary so long as the programs include a process of converting representative value data, which is also called centroid data, into so-called profile data. Therefore, for example, the following modification can be assumed.

(1) Depending on the structure of the mass spectrometric data, it may be possible to identify that the mass spectrometric data to be analyzed is representative data, by writing about the fact that the mass spectrometric data is indicated by the representative value data, in data header information, and without analyzing the data structure.

(2) The notation format of the representative value data or the conversion conditions themselves may be written in the header information of (1), and the data conversion process may be executed under the written conversion conditions.

(3) The data processor may include an interface via which the user is prompted to input a notation format of the representative value data, when the device processor determines that data is the representative value data based on the identification result of (1). As an interface, for example, the maximum intensity format, the gravity center intensity format, and the gravity center settlement format may be displayed and the user may select a format among them.

(4) The conversion conditions themselves may be written in the header information of (1), and the data processor may generate profile data from representative value data of the mass spectrometric data to be analyzed, based on the header information. When such a data structure is employed, the number of program steps can be reduced.

The mass spectrometric data processing program described above can be provided through a recording medium such as a CD-ROM or a data signal such as the Internet. The data processor 20 shown in FIG. 1 can load a program provided by the CD-ROM from the disk drive (DD) 26 and store it in the storage unit 30. Further, the data processor 20 can be supplied with a program from an external server (not shown) via the network cable NW. That is, the external server transmits the program as a data signal on a carrier wave, via the network cable NW. As described above, the program can be supplied as a computer-readable computer program product in various forms such as a recording medium and a data signal (carrier wave).

The present invention is not limited to the contents of the above embodiment. Other aspects conceivable within the scope of the technical idea of the present invention are also encompassed within the scope of the present invention.

REFERENCE SIGNS LIST

50 . . . mass spectrometric system, 10 . . . mass spectrometric device, 20 . . . data processor, 22 . . . CPU, 23 . . . memory, 24 . . . display device, 25 . . . input unit, 30 . . . storage unit, server . . . SW

The invention claimed is:

1. A non-transitory computer readable medium including a mass spectrometric data processing program that processes mass spectrometric data, the mass spectrometric data processing program causing a data processor including a computer to:
execute a data conversion process in which representative value data, which is representative value data including a data set of a representative value of mass-to-charge ratio information and an ion intensity with respect to the representative value, is converted into profile data, which is ion intensity data with respect to the mass-to-charge ratio information;
determine whether the mass spectrometric data is the representative value data;
if the mass spectrometric data is the representative value data, load a notation format of the representative value;
determine the conversion condition based on the loaded notation format; and
convert the representative value data into the profile data based on the determined conversion condition.

2. The non-transitory computer readable medium including the mass spectrometric data processing program according to claim 1, wherein:
when the data processor converts the representative value data into the profile data, at least one of pieces of information corresponding to a type of the representative value data, a type of data representing the ion intensity, a detection principle of the mass spectrometry device that acquired the mass spectrometric data, and a resolution of the mass spectrometry device that acquired the mass spectrometric data is loaded as processing information for determining the conversion process, and a conversion condition is determined based on the loaded processing information.

3. The non-transitory computer readable medium including the mass spectrometric data processing program according to claim 2, causing the data processor to:
load the at least one piece of information from the mass spectrometric data; and
determine the conversion condition based on the at least one piece of information.

4. The non-transitory computer readable medium including the mass spectrometric data processing program according to claim 1, causing the data processor to:
determine whether the mass spectrometric data is the representative value data;
if the mass spectrometric data is the representative value data, determine whether processing information for determining a conversion process in the data conversion process is included; and
if it is determined that the processing information is included, determine a conversion condition of the conversion process based on the processing information.

5. A non-transitory computer readable medium including a mass spectrometric data processing program that processes mass spectrometric data, the mass spectrometric data processing program causing a data processor including a computer to:
execute a data conversion process in which representative value data, which is representative value data including a data set of a representative value of mass-to-charge ratio information and an ion intensity with respect to the representative value, is converted into profile data, which is ion intensity data with respect to the mass-to-charge ratio information;
display a message on a display device, the message prompting the user to input the at least one piece of information;
load the at least one piece of information input to an input unit by the user; and
determine the conversion condition based on the at least one piece of information, wherein:
when the data processor converts the representative value data into the profile data, at least one of pieces of information corresponding to a type of the representative value data, a type of data representing the ion intensity, a detection principle of the mass spectrometry device that acquired the mass spectrometric data, and a resolution of the mass spectrometry device that acquired the mass spectrometric data is loaded as processing information for determining the conversion process, and a conversion condition is determined based on the loaded processing information and the at least one piece of information.

* * * * *